US006873025B2

(12) United States Patent
Wada et al.

(10) Patent No.: US 6,873,025 B2
(45) Date of Patent: Mar. 29, 2005

(54) PHOTODIODE DEVICE INCLUDING WINDOW DEFINED IN PASSIVATION LAYER FOR REMOVING ELECTROSTATIC CHARGE

(75) Inventors: Hideo Wada, Tenri (JP); Isamu Ohkubo, Kashiba (JP); Kazuhiro Natsuaki, Sakurai (JP); Naoki Fukunaga, Soraku-gun (JP); Shigeki Hayashida, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/984,657

(22) Filed: Oct. 30, 2001

(65) Prior Publication Data

US 2002/0038868 A1 Apr. 4, 2002

(30) Foreign Application Priority Data

Oct. 31, 2000 (JP) ...................................... 2000-334015
Oct. 2, 2001 (JP) ...................................... 2001-306975

(51) Int. Cl.[7] .............................................. H01L 31/06
(52) U.S. Cl. ...................... 257/461; 257/462; 257/431; 257/432; 257/437
(58) Field of Search ................................ 257/431, 432, 257/437, 227, 53, 79, 184, 343, 435, 443, 446, 461–464; 372/43

(56) References Cited

U.S. PATENT DOCUMENTS

| 4,980,315 A | * | 12/1990 | Einthoven et al. | .......... 437/141 |
|---|---|---|---|---|
| 5,144,381 A | * | 9/1992 | Furuyama et al. | ............. 357/30 |
| 5,177,581 A | * | 1/1993 | Kubo et al. | .................. 257/437 |
| 5,217,539 A | * | 6/1993 | Fraas et al. | .................. 136/246 |
| 5,391,910 A | * | 2/1995 | Fujimura et al. | ........... 257/458 |
| 5,401,986 A | * | 3/1995 | Cockrum et al. | ........... 257/188 |
| 5,418,396 A | * | 5/1995 | Mita | .......................... 257/461 |
| 5,466,962 A | * | 11/1995 | Yamamoto et al. | ......... 257/437 |
| 5,602,415 A | * | 2/1997 | Kubo et al. | ................. 257/443 |
| 5,825,071 A | * | 10/1998 | Takakura | ..................... 257/440 |
| 5,976,908 A | * | 11/1999 | Kwon et al. | .................. 438/69 |
| 6,005,276 A | * | 12/1999 | Forrest et al. | .............. 257/432 |
| 6,333,544 B1 | * | 12/2001 | Toyoda et al. | .............. 257/431 |
| 2002/0185588 A1 | * | 12/2002 | Wagner et al. | ........... 250/214.1 |

FOREIGN PATENT DOCUMENTS

| EP | 0977269 A1 | * | 7/1999 | ......... H01L/27/146 |
|---|---|---|---|---|
| JP | 402017678 | * | 1/1990 | ....... H01L/31/0264 |
| JP | 08-260043 | | 10/1996 | |
| JP | 10-084102 | | 3/1998 | |
| JP | 10-107243 | | 4/1998 | |
| JP | 11-40790 A | | 2/1999 | |
| JP | 11-040790 | | 2/1999 | |
| JP | 11-121784 | * | 4/1999 | ........... H01L/31/10 |

OTHER PUBLICATIONS

Stanley Wolf, Silicon Processing for the VLSI Era, 1990, vol. II, 273–275.*

* cited by examiner

Primary Examiner—Amir Zarabian
Assistant Examiner—Monica Lewis
(74) Attorney, Agent, or Firm—Nixon & Vanderhye P.C.

(57) ABSTRACT

A photodiode includes a first conductivity type semiconductor substrate or a first conductivity type semiconductor layer; a second conductivity type semiconductor layer provided on the first conductivity type semiconductor substrate or the first conductivity type semiconductor layer; an antireflection film provided on a surface of a portion of the second conductivity type semiconductor layer which is in a light receiving area; a first conductive layer provided in an area in the vicinity of the light receiving area; and a passivation layer provided on the first conductive layer. Light incident on the photodiode is detected by a junction of the one of the first conductivity type semiconductor substrate and the first conductivity type semiconductor layer, and the second conductivity type semiconductor layer. The area in the vicinity of the light receiving area includes a window area having an opening in the passivation layer for partially exposing the first conductive layer.

20 Claims, 17 Drawing Sheets

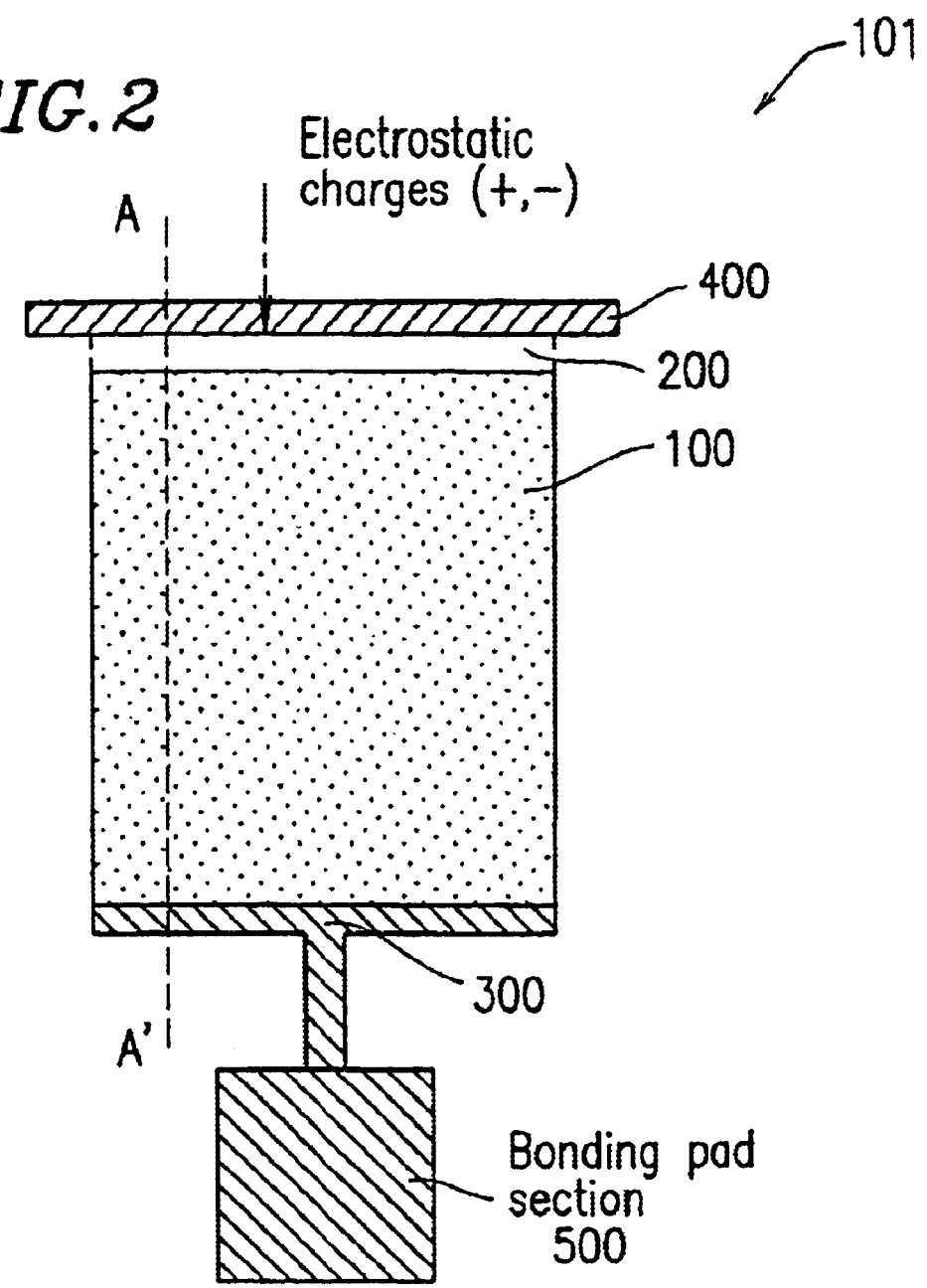

PHOTODIODE DEVICE INCLUDING WINDOW DEFINED IN PASSIVATION LAYER FOR REMOVING ELECTROSTATIC CHARGE

BACKGROUND OF THE INVENTION

1. Field of the Invention:

The present invention relates to a photodiode including an anti-reflection film provided on a surface of a light receiving area and a light shielding layer provided in the vicinity of the light receiving area, and a light receiving device with a built-in circuit including such a photodiode.

2. Description of the Related Art:

Conventionally, a photodiode for performing photoelectric conversion has been widely used as, for example, a signal detection device of an optical pickup, or a light receiving device on a receiving side of an optical space transmission system or an optical fiber link. Along with recent improvement in the operation speed of optical pick-ups of DVD apparatuses and the like, and also along with recent improvement in data transmission speed, there is a demand for a higher performance photodiode having a higher response speed and for a light receiving device with a built-in circuit including such a photodiode. Especially, there is a demand for a photodiode having a higher level of photosensitivity and reduced high frequency noise as well as a higher response speed.

In order to have an improved level of photosensitivity, a photodiode needs to have an antireflection film as a top layer of a light receiving area thereof for reducing the reflectance of light incident on the photodiode and thus preventing the incident light from being lost by reflection at the surface of the light receiving area. Such an anti-reflection film is formed of a lamination structure of a thin silicon oxide layer and a thin silicon nitride layer. The lamination structure is provided as a top layer of the light receiving area of a photodiode, and is set to have an appropriate thickness in accordance with the wavelength of the incident light so as to optimize the reflectance of the incident light. For example, Japanese Laid-Open Publication No. 10-84102 discloses an anti-reflection film formed of a silicon oxide layer having a thickness of 10 nm and a silicon nitride layer having a thickness of 50 nm in order to optimize light, emitted by a semiconductor laser device, having a wavelength commonly used for a CD or DVD-ROM apparatus (e.g., 780 nm).

In the field of optical discs, apparatuses using laser light having a shorter wavelength for reading and writing data are now developed. As the wavelength of the laser light is shorter, the diameter of the optical beam is smaller and so the recording density of optical discs can be improved. Such reduction in the wavelength of the laser light requires the silicon oxide layer and the silicon nitride layer included in the anti-reflection film to be even thinner, for the purpose of reducing the optical loss caused by the reflection at the surface of the photodiode and thus improving the photosensitivity of the photodiode.

In order to have an improved response speed and reduced high frequency noise, a photodiode needs to have a reduced junction capacitance at a P-N junction thereof. This is preferably realized by increasing the resistance of a semiconductor layer included in the light receiving area. However, this technique increases the inner series resistance of the photodiode and therefore does not sufficiently improve the response speed. In an attempt to solve this problem, Japanese Laid-Open Publication No. 8-260043 discloses a photodiode device 1000 having a structure shown in FIG. 17.

The photodiode device 1000 includes a P-type silicon layer 21 and an $N^-$-type epitaxial layer 24 laminated on the P-type silicon layer 21. At an interface between the P-type silicon layer 21 and the $N^-$-type epitaxial layer 24, $P^+$-type buried diffused layers 22 are provided with a prescribed distance therebetween. In the $N^-$-type epitaxial layer 24, a $P^+$-type isolating diffused layer 22a is provided on each $P^+$-type buried diffused layer 22. The $P^+$-type buried diffused layers 22 and the $P^+$-type isolating diffused layers 22a divide the $N^-$-type epitaxial layer 24 into a plurality of regions. A photodiode device 1000 detects incident light by a P-N junction at an interface between each region of the $N^-$-type epitaxial layer 24 and the P-type silicon substrate 21. Thus, a plurality of photodiodes are formed including the interface between the P-type silicon substrate 21 and the $N^-$-type epitaxial layer 24.

Reference numeral 29 represents a light receiving area of the photodiode device 1000. The light receiving area 29 has the following structure. At the interface between the P-type silicon layer 21 and the $N^-$-type epitaxial layer 24, $N^+$-type buried diffused layers 23 are provided in the vicinity of, and so as to interpose, the $P^+$-type buried diffused layer 22 and the $P^+$-type isolating diffused layer 22a, which are provided so as to divide the light receiving area 29. A $P^+$-type diffused layer 26 is provided above, and so as to overlap the $N^+$-type buried diffused layers 23. The $P^+$-type diffused layer 26 includes a part of the $P^+$-type isolating diffused layer 22a.

The $N^-$-type epitaxial layer 24, the $P^+$-type isolating diffused layer 22a and the $P^+$-type diffused layer 26 is covered with a continuous anti-reflection film 25. The anti-reflection film 25 includes a silicon oxide layer 25a and a silicon nitride layer 25b laminated on the silicon oxide layer 25a. A conductive light shielding layer 27 is provided on portions of the anti-reflection film 25 which are in the vicinity of the light receiving area 29. An insulating passivation layer 28 is provided so as to cover the entirety of the conductive light shielding layer 27.

As described above, the $N^+$-type buried diffused layers 23, which have a low resistance, are provided only in the vicinity of the $P^+$-type buried diffused layer 22 and the $P^+$-type isolating diffused layer 22a, which divide the light receiving area 29. Due to such a structure, the photodiodes have a reduced inner series resistance and a reduced junction capacitance.

The photodiode device 1000 having the above-described structure is first produced as a wafer, and then the wafer is divided into a plurality of chips by a dicing step. During the dicing step, a large amount of electrostatic charges are generated on the surface of the wafer; more specifically, on the light receiving area 29, and on the silicon nitride layer 25b and the insulating passivation layer 28 in an area in the vicinity of the light receiving area 29. Such electrostatic charges may undesirably cause electrostatic destruction of the photodiodes formed below the surface of the wafer. Such a large amount of electrostatic charges are generated by friction between the wafer and pure water sprayed to the wafer during the dicing step. One technique adopted in order to suppress the generation of the electrostatic charges is to mix carbon dioxide gas with the pure water to be sprayed to the wafer so as to increase the conductivity.

Even this technique cannot sufficiently suppress the generation of the electrostatic charges on the surface of the wafer, since a change in the flow rate of the pure water and a change in the flow rate of the carbon dioxide gas change the specific resistance of the pure water. Mixing a great amount of carbon dioxide gas can reduce the specific resistance of the pure water and thus suppress the generation of electrostatic charges, but this technique is not practical because reduction in the specific resistance of the pure water shortens the life of the blade used for dicing the wafer.

The electrostatic charges generated on the silicon nitride layer 25b in the vicinity of the light receiving area 29 generate electric charges at an interface state between the silicon oxide layer 25a and the silicon nitride layer 25b both having a small thickness. The electric charges invert the conductivity type of the semiconductor layer below the silicon oxide layer 25a and the silicon nitride layer 25b.

For example, the photodiode device 1000 shown in FIG. 17 acts as follows. When positive electrostatic charges are generated on the silicon nitride layer 25b in the vicinity of the light receiving area 29, negative electric charges are accumulated at the interface between the silicon oxide layer 25a and the silicon nitride layer 25b. As a result, a surface area of the N$^-$-type epitaxial layer 24 is inverted to be a P-type semiconductor layer. The resultant P-type semiconductor layer is electrically connected to the P$^+$-type isolating diffused layer 22a and the like, which increases the junction capacitance of the photodiodes.

As described above, optical pickups of recent optical disc apparatuses use laser light having a shorter wavelength. In order to reduce the reflection at the surface of a photodiode, the anti-reflection film of the photodiode has a reduced thickness. When the thickness of the silicon oxide layer included in the anti-reflection film is reduced, the ratio of the electric potential difference (generated by the electrostatic charges) which are applied to the semiconductor layer below the anti-reflection film is increased. Therefore, when the thickness of the anti-reflection film is reduced, the conductivity of the semiconductor layer is more easily inverted. As a result, the junction capacitance of the photodiode may be undesirably further increased by the generation of the electrostatic charges during the dicing step.

An increase in the junction capacitance of the photodiode decreases the response speed and increases the high frequency noise of the photodiode. Thus, the characteristics of the photodiode may be significantly deteriorated.

It is impossible to completely eliminate the generation of the electrostatic charges at the surface of the wafer during the dicing step. It is also impossible to remove the electric charges introduced by the electrostatic charges to the interface between the silicon oxide layer 25a and the silicon nitride layer 25b from the interface unless the interface is irradiated with high energy ultraviolet rays or the like, since such electric charges have a stable potential.

In order to prevent such an increase in the junction capacitance, Japanese Laid-Open Publication No. 11-40790 discloses a photodiode device 2000 shown in FIG. 18. Identical elements as those described with reference to FIG. 17 bear identical reference numerals therewith and detailed descriptions thereof are omitted.

The photodiode device 2000 includes a conductive light shielding layer 27 provided in the vicinity of a light receiving area 29, and an insulating passivation layer 28a provided on the light shielding layer 27 so as to partially cover the light shielding layer 27. More specifically, as shown in FIG. 18, an end 28b of the insulating passivation layer 28a is farther from the light receiving area 29 than an end 27b of the conductive light shielding layer 27. As a result, the end 27b of the conductive light shielding layer 27 is exposed. The photodiode device 2000 has an identical structure to that of the photodiode device 1000 shown in FIG. 17 on the other points.

In the photodiode device 2000 in which the end 27b of the conductive light shielding layer 27 is exposed, the large amount of electrostatic charges (positive charges) generated on the silicon nitride layer 25b can be removed through the end 27b of the conductive light shielding layer 27. Therefore, negative charges are not accumulated at the interface between the silicon oxide layer 25a and the silicon nitride layer 25b of the anti-reflection film 25.

The photodiode device 2000 have the following problems.

The conductive light shielding layer 27 is usually formed of AlSi. Al (aluminum) contained in AlSi has a strong tendency to be ionized. Therefore, when moisture containing impurities adheres to a surface of AlSi layer, electrons are exchanged at a portion of the surface having the moisture, thus corroding AlSi. The conductive light shielding layer 27 is also used as a signal line. Therefore, when the conductive light shielding layer 27 is corroded, the photodiodes suffer from the problems that (i) the light shielding characteristic is deteriorated and (ii) the signal line is ruptured and as a result, the electric signal obtained by the photoelectric conversion of the incident light cannot be detected.

A light receiving device with a built-in circuit including a photodiode includes a polysilicon electrode at a relatively shallow position in order to improve the operating speed of the transistor. When the AlSi layer used for the signal line contacts a polysilicon layer used for the electrode, silicon is deposited at the interface between the AlSi layer and the polysilicon layer. This causes a contact resistance. In order to prevent this, the photodiode device 2000 includes a titanium-tungsten alloy (TiW) layer (not shown) as a barrier metal layer for preventing the deposition of silicon, directly below the conductive light shielding layer 27 formed of AlSi.

However, in the structure shown in FIG. 18 in which the end 27b of the conductive light shielding layer 27 is exposed, the interface between the AlSi layer and the TiW layer is exposed to the outside air. When, for example, pure water is sprayed to the wafer in the dicing step, AlSi may be undesirably dissolved and corroded by a cell reaction. When the conductive light shielding layer 27 formed of AlSi is corroded, the light shielding characteristic of the conductive light shielding layer 27 in the light receiving area 29 is deteriorated, and the effect of preventing the negative charges from accumulating at the interface between the silicon oxide layer 25a and the silicon nitride layer 25b is reduced. When the light shielding characteristic provided by the conductive light shielding layer 27 is deteriorated, light may undesirably be incident on the photodiodes through areas other than the light receiving area 29 and then converted into an electric signal. This increases a noise component, resulting in deterioration of various characteristics of the photodiodes.

The structure shown in FIG. 17 in which the conductive light shielding layer 27 is covered with the insulating passivation layer 28 is less susceptible to corrosion but is more susceptible to electrostatic charges. The yield of photodiodes having the structure shown in FIG. 17 is lower than that of the photodiodes having the structure shown in FIG. 18.

SUMMARY OF THE INVENTION

According to one aspect of the invention, a photodiode includes one of a first conductivity type semiconductor substrate and a first conductivity type semiconductor layer; a second conductivity type semiconductor layer provided on the one of the first conductivity type semiconductor substrate and the first conductivity type semiconductor layer; an anti-reflection film provided on a surface of a portion of the second conductivity type semiconductor layer which is in a light receiving area; a first conductive layer provided in an area in the vicinity of the light receiving area; and a passivation layer provided on the first conductive layer. Light incident on the photodiode is detected by a junction of the one of the first conductivity type semiconductor substrate and the first conductivity type semiconductor layer, and the second conductivity type semiconductor layer. The area in the vicinity of the light receiving area includes a window area having an opening in the passivation layer for partially exposing the first conductive layer.

In one embodiment of the invention, the photodiode further includes an anti-corrosive conductive layer provided below the first conductive layer.

In one embodiment of the invention, the first conductive layer is divided into a portion acting as a signal line and a portion not acting as the signal line by a separation area formed by the passivation layer, and the window area is provided on the portion of the first conductive layer not acting as the signal line.

In one embodiment of the invention, the photodiode further includes a second conductive layer, wherein the first conductive layer is divided into the portion acting as the signal line and the portion not acting as the signal line by the separation area in the passivation layer, and the second conductive layer is provided below the separation area.

In one embodiment of the invention, the photodiode further includes a second conductive layer provided below the first conductive layer, and an anti-corrosive conductive layer provided below at least the second conductive layer.

In one embodiment of the invention, the photodiode further includes an anti-corrosive conductive layer for covering the opening.

In one embodiment of the invention, the anticorrosive conductive layer is formed of a titanium-tungsten alloy, the photodiode further comprising a gold layer on the anti-corrosive conductive layer.

In one embodiment of the invention, the opening has an area which is larger than $\frac{1}{50}$th of an area of the light receiving area.

In one embodiment of the invention, a distance between the window area and the light receiving area is 200 $\mu$m or less.

In one embodiment of the invention, the window area is provided between the light receiving area and a bonding pad section.

In one embodiment of the invention, the window area is provided so as to surround the bonding pad section.

In one embodiment of the invention, the window area is provided so as to surround the light receiving area.

In one embodiment of the invention, the window area is provided so as to surround the bonding pad section and the light receiving area.

In one embodiment of the invention, the window area is provided so as to surround the bonding pad section and the light receiving area.

In one embodiment of the invention, the photodiode further includes another first conductivity type semiconductor layer for dividing the second conductivity type semiconductor layer into a plurality of regions, the another first conductivity type semiconductor layer being provided on the one of the first conductivity type semiconductor substrate and the first conductivity type semiconductor layer, wherein the light incident on the photodiode is detected by a junction of the one of the first conductivity type semiconductor substrate and the first conductivity type semiconductor layer, and at least one of the plurality of regions of the second conductivity type semiconductor layer.

According to another aspect of the invention, a light receiving device with a built-in circuit includes a photodiode according to claim 1 and a signal processing circuit for processing an electric signal obtained by photoelectric conversion performed by the photodiode, the photodiode and the signal processing circuit being provided on a single substrate.

Thus, the invention described herein makes possible the advantages of providing a highly reliable photodiode having a superb high frequency characteristic for preventing a junction capacitance from increasing due to electrostatic charges generated in a dicing step and for preventing a signal line from being corroded; and a light receiving device with a built-in circuit including such a photodiode.

These and other advantages of the present invention will become apparent to those skilled in the art upon reading and understanding the following detailed description with reference to the accompanying figures.

BRIEF DESCRIPTION OF THE DRAWINGS

FIG. 2 is a plan view of the photodiode shown in FIG. 1;

DESCRIPTION OF THE PREFERRED EMBODIMENTS

Hereinafter, the present invention will be described by way of illustrative examples with reference to the accompanying drawings.

EXAMPLE 1

Figure 1:
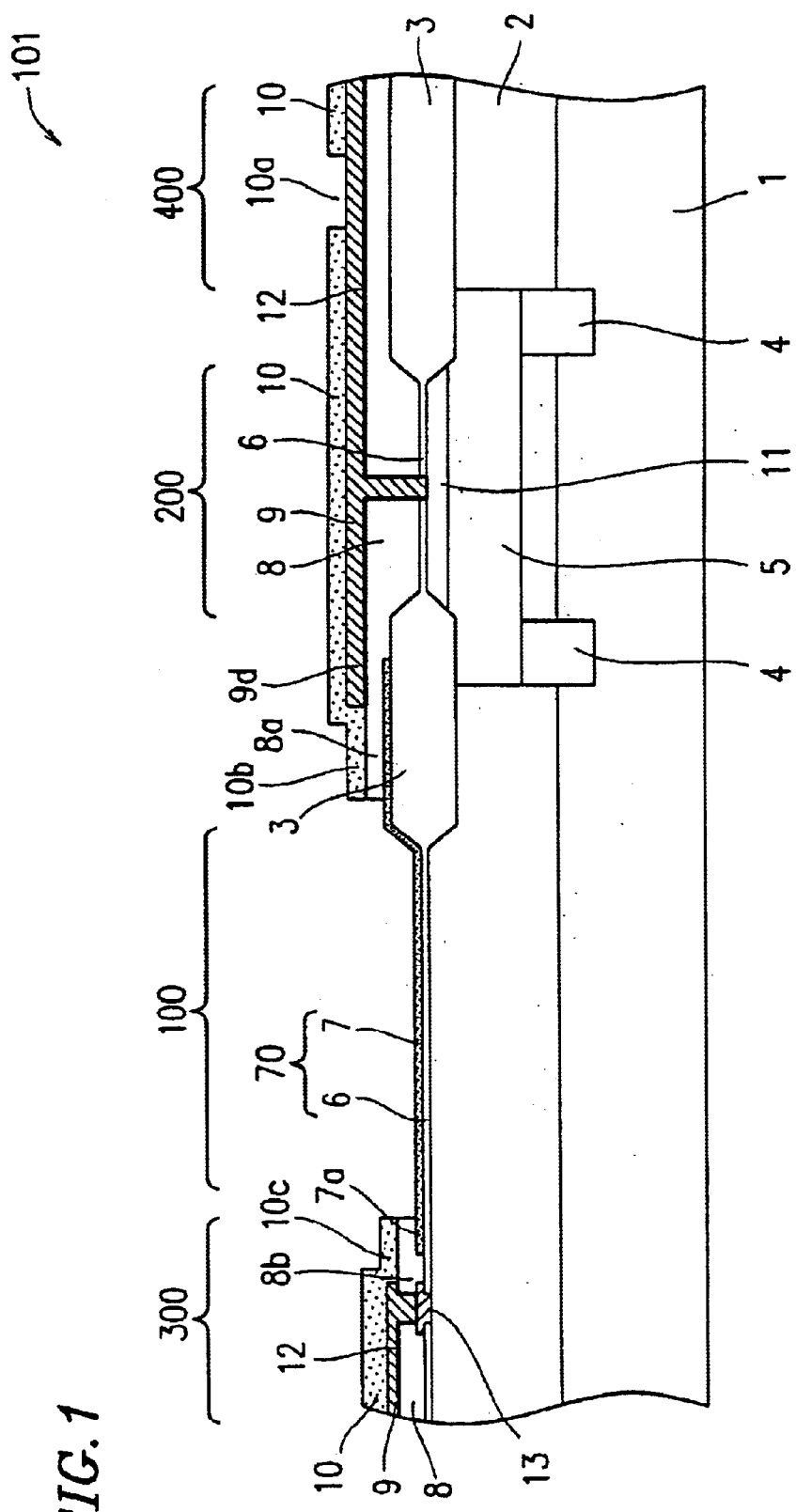
FIG. 1 is a cross-sectional view illustrating a structure of a photodiode according to a first example of the present invention.

FIG. 1 is a schematic cross-sectional view of a photodiode 101 according to a first example of the present invention. FIG. 2 is a schematic plan view of the photodiode 101 shown in FIG. 1. FIG. 1 is taken along line A-A' in FIG. 2.

The photodiode 101 includes a light receiving area 100 on which is light is incident, an anode section 200, a cathode section 300, and a window area 400 through which electrostatic charges are removed. As shown in FIG. 2, a bonding pad section 500 is connected to the cathode section 300 on the opposite side from the light receiving area 100.

In the thickness direction, the photodiode 101 includes a P-type semiconductor substrate 1 formed of, for example, silicon (in this specification, the P-type semiconductor substrate 1 is also referred to as the "P-type silicon substrate 1"), an N-type epitaxial layer 2 laminated on the P-type silicon substrate 1, and a plurality of P$^+$-type buried diffused layers 4 provided at selected positions at an interface between the P-type silicon substrate 1 and the N-type epitaxial layer 2. The N-type epitaxial layer 2 includes a P-type diffused layer 5 provided so as to bridge an area between two P$^+$-type buried diffused layers 4, and a P$^+$-type diffused layer 11 provided on the P-type diffused layer 5. A continuous thin silicon oxide layer 6 is provided on a continuous surface of the P$^+$-type diffused layer 11 and the N-type epitaxial layer 2. The P$^+$-type diffused layer 11 is interposed between LOCOS (LOCalized Oxidation of Silicon) structures 3. A LOCOS structure is an isolating oxide layer structure provided at a selected position in a semiconductor device. A region held between the LOCOS structures 3 acts as a signal region of the anode section 200 of the photodiode 101.

In the light receiving area 100, a thin silicon nitride layer 7 is provided on the thin silicon oxide layer 6, which is provided on the N-type epitaxial layer 2. The silicon oxide layer 6 and the thin silicon nitride layer 7 form an anti-reflection film 70. In the light receiving area 100, a P-N junction is formed at an interface between the P-type silicon substrate 1 and the N-type epitaxial layer 2. Due to such a structure, the photodiode 101 detects light incident on the light receiving area 100.

A photodiode according to the present invention may include an N-type diffused area formed by a selective diffusion step or the like. A photodiode according to the present invention may have layers of the opposite conductivity types to those shown in FIG. 1.

The LOCOS structures 3 provided in the vicinity of the anode section 200, the silicon oxide layer 6 interposed between the LOCOS structures 3, and the silicon nitride layer 7 are superposed by a silicon oxide layer 8. The silicon oxide layer 8 is superposed by a TiW (titanium-tungsten alloy) layer 12, which is in turn superposed by an AlSi layer 9. The TiW layer 12 and the AlSi layer 9 are not provided on an end 8a of the silicon oxide layer 8 facing the light receiving area 100. The AlSi layer 9 is provided as a conductive light shielding layer, and the TiW layer 12 is provided as an anticorrosive metal layer. The AlSi layer 9 and the TiW layer 12 together act as a signal line.

In the anode section 200, the silicon oxide layer 6 provided on the P$^+$-type diffused layer 11 and the silicon oxide layer 8 have an opening (contact hole). The opening is filled with the TiW layer 12 and the AlSi layer 9, so that the TiW layer 12 and the AlSi layer 9 contact the P$^+$-type diffused layer 11. A portion of the TiW layer 12 and a portion of the AlSi layer 9 which are above the P-type diffused layer 5 together act as an anode electrode of the anode section 200.

The end 8a of the silicon oxide layer 8 which is not covered with the TiW layer 12 or the AlSi layer 9 is superposed by, for example, an insulating PSG (Phospho-Silicate Glass, i.e., phosphorus-containing silicon oxide) passivation layer (hereinafter, referred to as a "PSG passivation layer") 10. The PSG passivation layer 10 has an opening 10a at an appropriate distance away from the anode section 200. The opening 10a and an area of the PSG passivation layer 10 in the vicinity of the opening 10a act as the window area 400.

The cathode section 300 adjacent to the light receiving area 100 has the following structure. The silicon oxide layer 6 is provided on the N-type epitaxial layer 2. The silicon nitride layer 7 which is provided on the silicon oxide layer 6 in the light receiving area 100 terminates in the cathode section 300. The silicon oxide layer 8 is provided on the silicon oxide layer 6 and on an end 7a of the silicon nitride layer 7. The silicon oxide layer 8 is superposed by the TiW layer 12 except for an end 8b thereof. The TiW layer 12 is superposed by the AlSi layer 9. The silicon oxide layer 6 and the silicon oxide layer 8 have an opening (contact hole) at a position proximate to the light receiving area 100. A polysilicon electrode 13 is provided in the opening. A space of the opening above the polysilicon electrode 13 is filled with the TiW layer 12 and the AlSi layer 9. The polysilicon electrode 13 acts as a cathode electrode of the cathode section 300. The AlSi layer 9 and the silicon oxide layer 8 are covered with, for example, the PSG passivation layer 10.

The AlSi layer 9 is used as a light shielding layer for preventing light from being incident on areas other than the light receiving area 100 and also as a signal line. The TiW layer 12, which is used as a signal line together with the AlSi layer 9, is anti-corrosive and prevents the signal line from being electrically ruptured even when a portion of the AlSi layer 9 exposed to the opening 10a is corroded. The TiW layer 12 is also used as a barrier metal layer f or preventing Al (aluminum) of the AlSi layer 9 from diffusing into the semiconductor layers provided on the P-type silicon substrate 1.

In this specification, the light receiving area 100 is defined as area held between the light shielding layer (AlSi layer 9) in the anode section 200 and the light shielding layer (AlSi layer 9) in the cathode section 300.

The photodiode 101 shown in FIGS. 1 and 2 is produced, for example, as follows. The bonding pad section 500 connected to the cathode section 300 has the same structure as that of the window area 400.

The plurality of P+-type buried diffused layers 4 are formed at prescribed positions on the P-type silicon substrate 1. The N-type epitaxial layer 2 is laminated on the entire surface of the P-type silicon substrate 1 so as to cover the P+-type buried diffused layers 4. Impurities are diffused toward a portion of the N-type epitaxial layer 2 between the P+-type buried diffused layers 4 from a surface of the N-type epitaxial layer 2. By the impurity diffusion, the P-type diffused layer 5 is formed. The P-type diffused layer 5 has an anode contact shape in order to reduce the anode resistance.

Next, the plurality of LOCOS structures 3 are formed at prescribed positions in the N-type epitaxial layer 2. Each LOCOS structure 3 is formed so that an end thereof is above the corresponding P+-type buried diffused layer 4. Then, the silicon oxide layer 6 having a prescribed thickness is formed by thermal oxidation of the surface of the N-type epitaxial layer 2 in the light receiving area 100, an area in the vicinity thereof, and the anode section 200. On the silicon oxide layer 6, the silicon nitride layer 7 having a prescribed thickness is formed by CVD (chemical vapor deposition) or the like. In this manner, the anti-reflection film 70 including two layers (i.e. silicon oxide layer 6 and the silicon nitride layer 7) is formed. The thickness of each of the silicon oxide layer 6 and the silicon nitride layer 7 is set so as to sufficiently reduce the reflectance of a wavelength of light incident on the light receiving area 100 of the photodiode 101. In the anode section 200, impurities are diffused from a surface of a portion of the P-type diffused layer 5 interposed between the LOCOS structure 3, thereby forming the P+-type diffused layer 11. Thus, the anode resistance is reduced.

The P+-type diffused layer 11 may be formed before or after the LOCOS structures 3 and the anti-reflection film 70 including the silicon oxide layer 6 and the silicon nitride layer 7 are formed. This is realized by appropriately changing the production process.

Next, the opening is formed by etching in the silicon oxide layer 6 at a prescribed position in the cathode section 300. A polysilicon layer is deposited in the opening, thereby forming the polysilicon electrode 13 acting as the cathode electrode.

Then, the silicon oxide layer 8 is formed by CVD or the like on the entire surface of the resultant lamination. The contact holes are formed by etching in the silicon oxide layer 8 and the silicon oxide layer 6 so that contact holes reach the polysilicon electrode 13 (in the cathode section 300) and the P+-type diffused layer 11 (in the anode section 200). Then, the TiW layer 12 and the AlSi layer 9 are formed on the entire surface of the silicon oxide layer 8 and in the contact holes. A portion of the silicon oxide layer 8, a portion of the TiW layer 12 and a portion of the AlSi layer 9 which are in the light receiving area 100 are removed by etching. In this manner, the TiW layer 12 and the AlSi layer 9 are formed as shown in FIG. 1. The TiW layer 12 and the AlSi layer 9 are electrically connected to the anode electrode and together used as a signal line.

Next, the PSG passivation layer 10 is formed on the entire surface of the resultant lamination so as to cover the TiW layer 12 and the AlSi layer 9. A portion of the PSG passivation layer 10 which is in the light receiving area 100 is removed by photolithography and etching. The PSG passivation layer 10 is etched so as not to expose ends of the TiW layer 12 and the AlSi layer 9. The PSG passivation layer 10 is also etched so that ends 10b and 10c thereof are positionally aligned with the ends 8a and 8b of the silicon oxide layer 8, respectively. A portion of the PSG passivation layer 10 at a prescribed distance away from the anode section 200 is removed, thereby forming the opening 10a for exposing the AlSi layer 9. The opening 10a and an area in the vicinity thereof act as the window area 400. A portion of the PSG passivation layer 10 which covers the bonding pad section 500 is also removed so as to form an opening in the bonding pad section 500. Since the structure of the bonding pad section 500 and the opening therein is substantially the same as that of the window area 400 and the opening 10a, and thus is not shown. In this manner, the photodiode 101 shown in FIG. 1 is produced.

As described above, a photodiode is usually first produced as a wafer, and then the wafer is divided into a plurality of chips. When the wafer is divided into chips, a large amount of electrostatic charges are generated on the surface of the wafer, i.e., on the anti-reflection film including the silicon oxide layer and the silicon nitride layer and on the insulating passivation layer such as, for example, the PSG passivation layer.

In the photodiode 101 in the first example of the present invention, the window area 400 having the opening 10a exposing the AlSi layer 9 is provided at a prescribed distance away from the anode section 200, which is proximate to the light receiving area 100. Due to such a structure, the electrostatic charges can be removed through the AlSi layer 9 exposed to the opening 10a in the window area 400.

Five photodiode samples having the structure shown in FIG. 1 (having a window area having an opening for exposing the AlSi layer) and five photodiode samples which do not have such a window area were tested for the ratio at which the response characteristic exhibits an abnormal waveform (defective samples/total samples measured). In the case of the photodiodes which do not have the window area (i.e., the photodiodes which do not have any means against electrostatic charges), four out of five samples were defective. In the case of the photodiodes having the structure shown in FIG. 1, none of the five samples exhibited any response characteristic having an abnormal waveform.

Figure 3A:
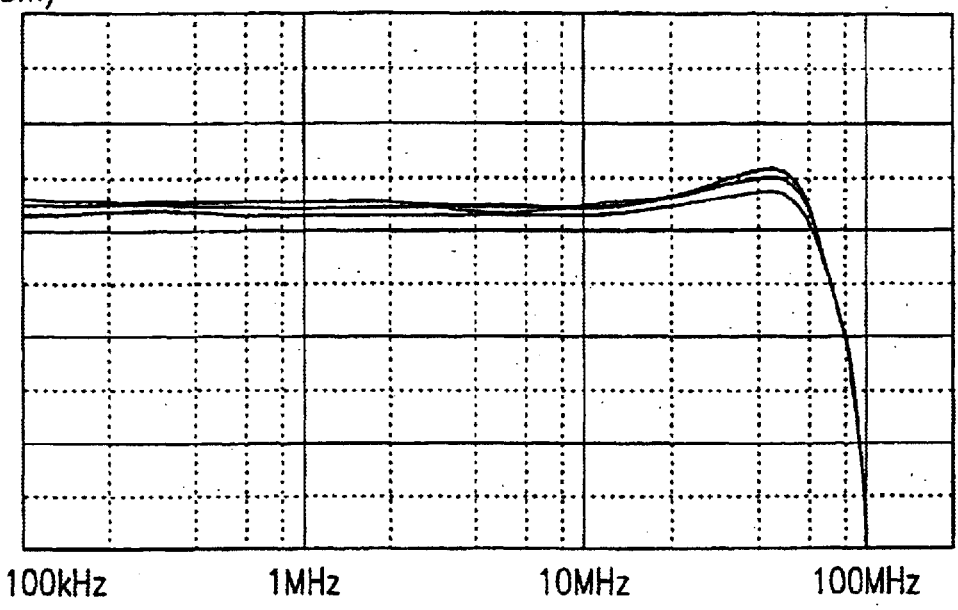
FIG. 3A is a graph illustrating a response characteristic of photodiodes having the structure shown in FIG. 1.
Figure 3B:
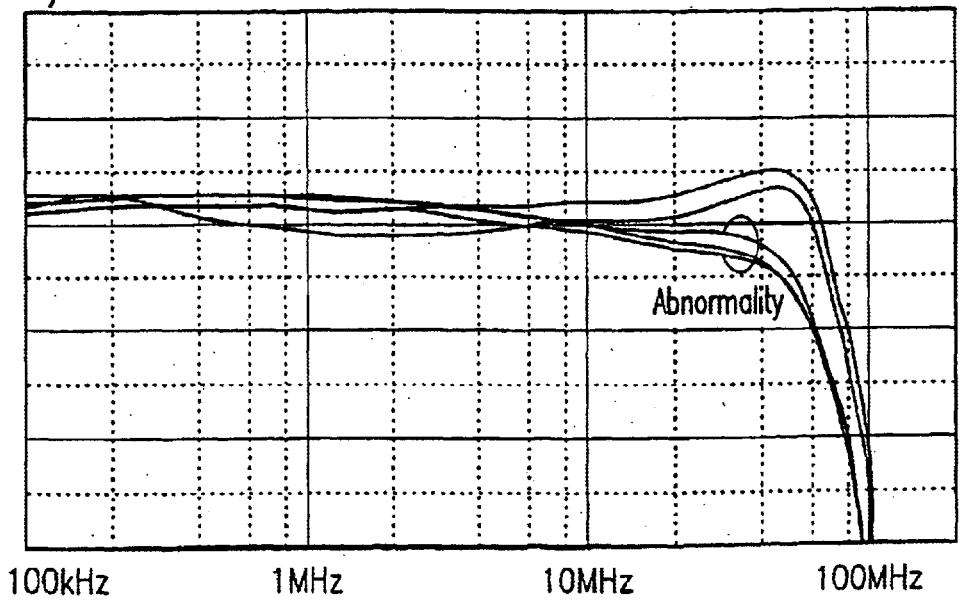
FIG. 3B is a graph illustrating a response characteristic of photodiodes with no means for removing electrostatic charges.

FIGS. 3A and 3B are graphs illustrating the output value of the photodiodes with respect to the frequency, obtained in this experiment. In FIGS. 3A and 3B. the vertical axis represents the output value (dB), and the horizontal axis represents the frequency (Hz). FIG. 3A shows the results of the photodiodes having the window area as shown in FIG. 1. It is appreciated that all five samples are normal. FIG. 3B shows the results of the photodiodes having no window area. It is appreciated that four out of five samples exhibited a response characteristic having an abnormal waveform.

Figure 18:
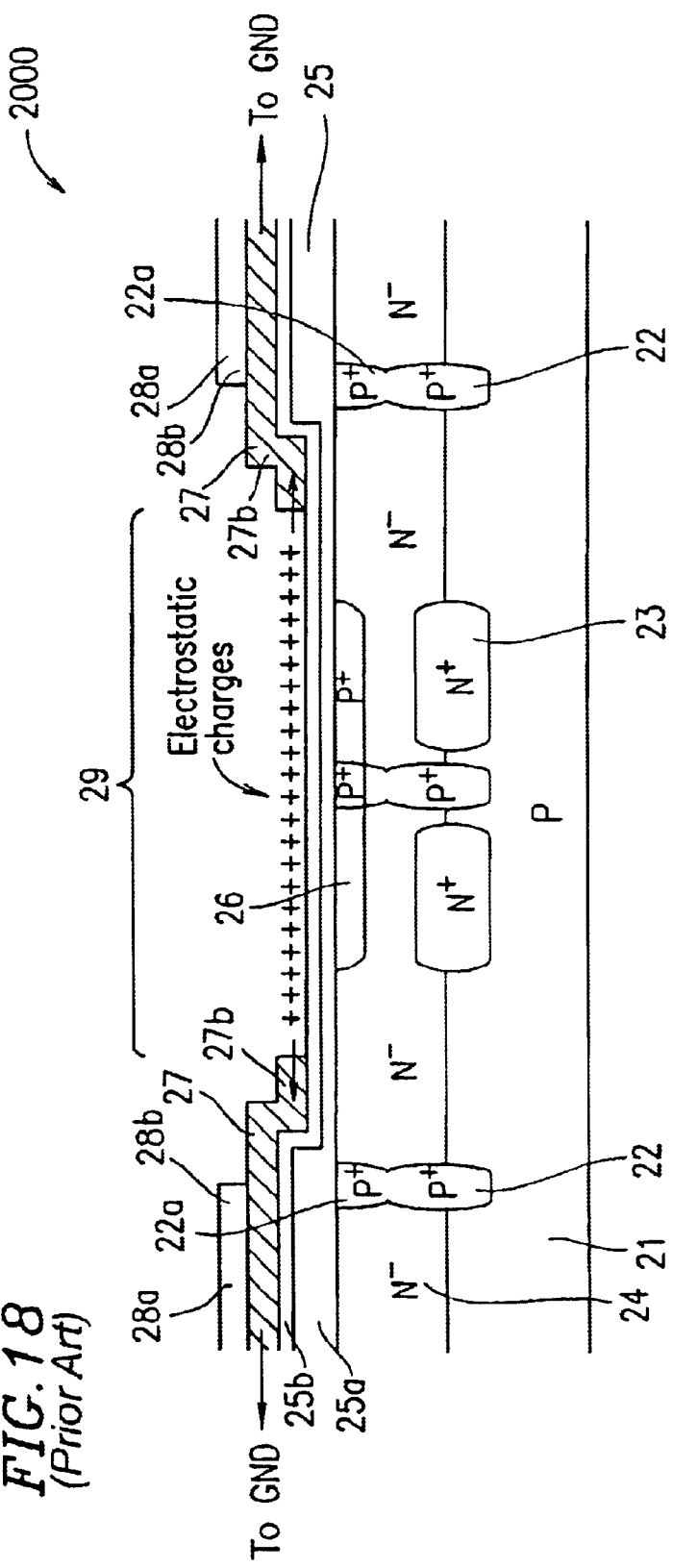
FIG. 18 is a cross-sectional view illustrating another structure of a conventional photodiode.

Unlike the conventional photodiode 2000 shown in FIG. 18, the photodiode 101 has the TiW layer 12 and the AlSi layer 9 covered with the PSG passivation layer 10. Therefore, an end 9d of the AlSi layer 9 facing the light receiving area 100 is not corroded. Even when a portion of the AlSi layer 9 exposed to the opening 10a is corroded, the TiW layer 12, which is anti-corrosive, is provided below the AlSi layer 9 and thus prevents the signal line from being electrically ruptured.

In the photodiode 101, the insulating PSG passivation layer 10 has the opening 10a for removing the electrostatic charges. The step of forming the window area 400 is the same as the step of forming the bonding pad section 500. In a structure in which the bonding pad section 500 having an opening is provided in the vicinity of the light receiving area 100, substantially the same effect of removing the electrostatic charges is provided. Therefore, the window area 400 having the opening 10a may act as the bonding pad section 500 having an opening.

Figure 4:
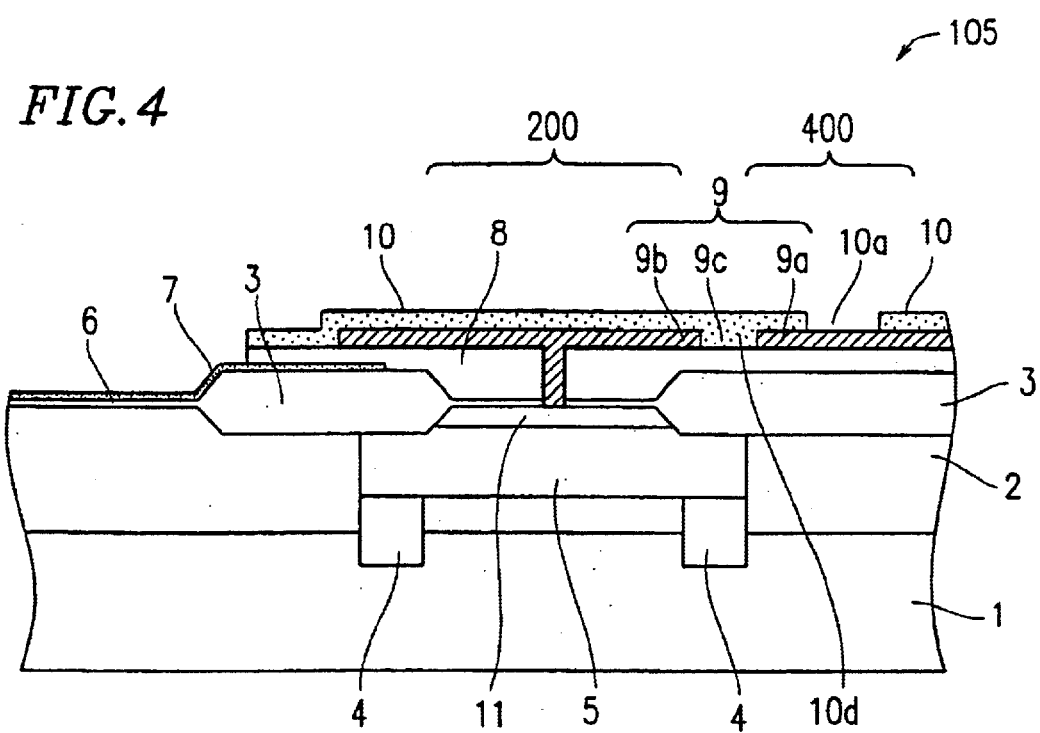
FIG. 4 is a cross-sectional view illustrating another structure of a photodiode according to the first example of the present invention.

FIG. 4 is a schematic cross-sectional view of a photodiode 105 as a modification of the first example of the present invention. As shown in FIG. 4, the AlSi layer 9 is divided into an anode-side portion 9a and a window-side portion 9b by a separation opening 9c filled with the PSG passivation layer 10 (separation area 10d). The window-side portion 9a has the opening 10a. The anode-side portion 9b acts as a signal line including the anode electrode. The window-side portion 9a of the AlSi layer 9 is partially exposed to the opening 10a. Even when the exposed portion of the window-side portion 9a of the AlSi layer 9 is corroded, the anode-side portion 9b of the AlSi layer 9 acting as the signal line is not electrically ruptured by the corrosion since the AlSi layer 9b is separated from the window-side portion 9a and protected by the PSG passivation layer 10. Therefore, the photodiode 105 has an improved reliability.

The photodiode 101 in FIG. 1 and the photodiode 105 in FIG. 4 detect a signal by a P-N junction formed at an interface between the P-type semiconductor substrate 1and the N-type epitaxial layer 2. The present invention is not limited to such a structure. For example, the photodiode according to the present invention may detect a signal by a P-N junction formed at an interface between a semiconductor substrate and a region formed by diffusing impurities of a conductivity type opposite to that of the semiconductor substrate. This is common to the examples described in this specification and any modifications or alterations thereof. The layers included in the photodiode may have the opposite conductivity type. This is also common to the examples described in this specification and any modifications or alterations thereof.

EXAMPLE 2

Figure 5:
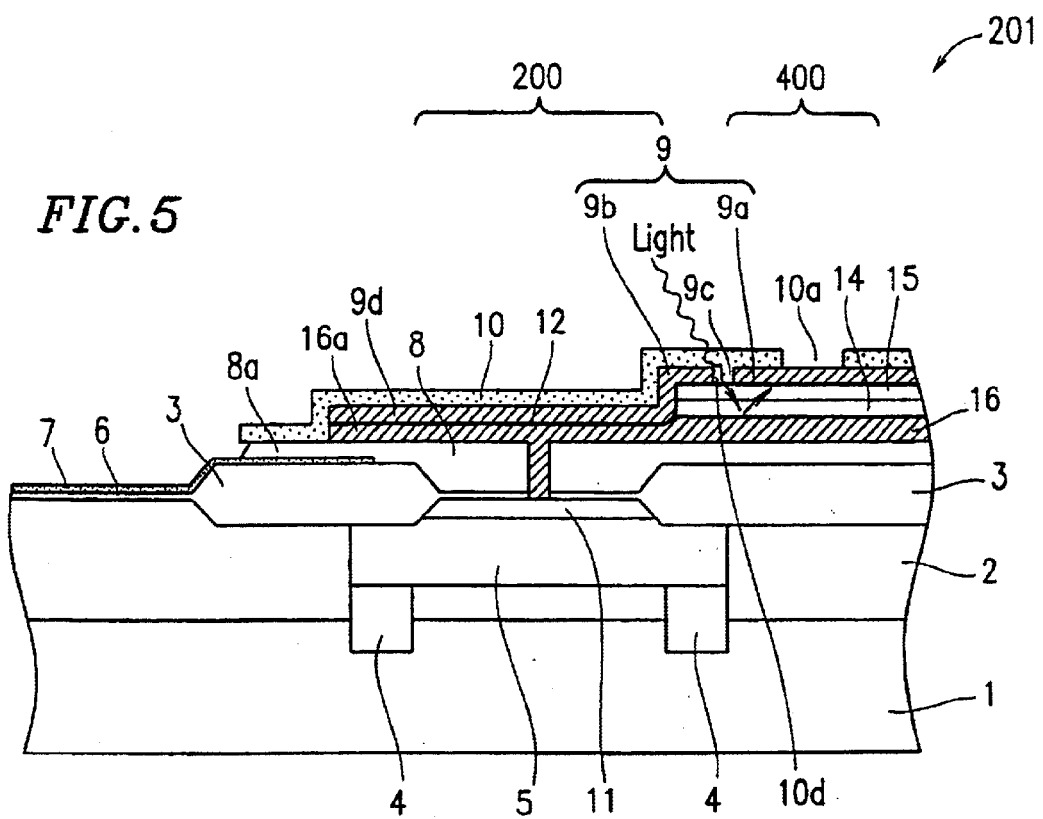
FIG. 5 is a cross-sectional view illustrating a structure of a photodiode according to a second example of the present invention.

FIG. 5 is a schematic cross-sectional view of a photodiode 201 according to a second example of the present invention. Identical elements as those described with reference to FIG. 1 bear identical reference numerals therewith and detailed descriptions thereof are omitted. In FIG. 5, the cathode section 300 and a part of the light receiving area 100 are omitted.

The photodiode 201 includes a first AlSi layer 9 and a second AlSi layer 16 which together act as a signal line and a light shielding layer. The second AlSi layer 16 is provided on the silicon oxide layer 8, which is provided on the LOCOS structures 3 and on the silicon oxide layer 6. The second AlSi layer 16 is not provided on an end 8a of the silicon oxide layer 8. In the anode section 200, the second AlSi layer 16 is superposed by a TiW layer 12, which is superposed by a first AlSi layer 9. The TiW layer 12, which is anti-corrosive, also act the signal line together with the first and second AlSi layers 9 and 16. In the window area 400 (i.e., an area corresponding to one of the LOCOS structures 3), a silicon nitride layer 14 and a PSG passivation layer 15 provided on the silicon nitride layer 14 are interposed between the second AlSi layer 16 and the TiW layer 12. The silicon nitride layer 14 and the PSG passivation layer 15 are both formed of an insulating material and act as an interlevel insulating layer (or inter-layer dielectrics).

A PSG passivation layer 10 is laminated on the first AlSi layer 9 and the silicon oxide layer 8 so as to cover an end 16a of the second AlSi layer 16 and an end 9d of the first AlSi layer 9.

A portion of the first AlSi layer 9 which is on the PSG passivation layer 15 with the TiW layer 12 interposed therebetween is divided into an anode-side portion 9b and a window-side portion 9a by a separation opening 9c. The separation opening 9c is filled with the PSG passivation layer 10. The portion of the PSG passivation layer 10 in the separation opening 9c acts as a separation area 10d.

A window area 400 including an opening 10a is formed in the PSG passivation layer 10 at a prescribed position on the window-side portion 9a of the first AlSi layer 9. Thus, the window-side portion 9a is partially exposed to the opening 10a. The anode-side portion 9b of the first AlSi layer 9 acts as a signal line including an anode electrode.

The photodiode 201 according to the second example has substantially the same structure as that of the photodiodes 101 and 105 shown in FIGS. 1 and 4 on the other points.

In the photodiode 201 shown in FIG. 5, the anode-side portion 9b acting as the signal line is electrically separated from the window-side portion 9a partially exposed to the opening 10a for removing the electrostatic charges, by the PSG passivation layer 10 in the separation opening 9c. Due to such a structure, even when the exposed portion of the window-side portion 9a is corroded, the anode-side portion 9b acting as the signal line is not corroded since the anode-side portion 9b is protected by the PSG passivation layer 10.

The photodiode 201 also has the following advantage. Even when light acting as noise to the light to be converted into an electric signal is incident through the separation opening 9c, the light acting as noise can be shielded with certainty by the second AlSi layer 16. Therefore, the photodiode 201 can have a sufficiently high S/N ratio.

Figure 6:
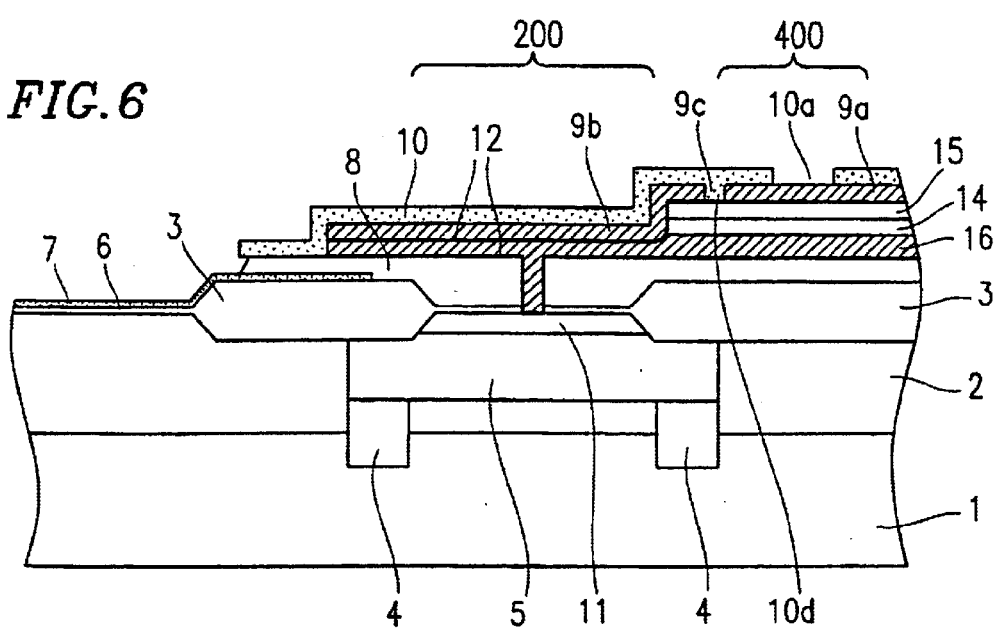
FIG. 6 is a cross-sectional view illustrating another structure of a photodiode according to the second example of the present invention.
Figure 7:
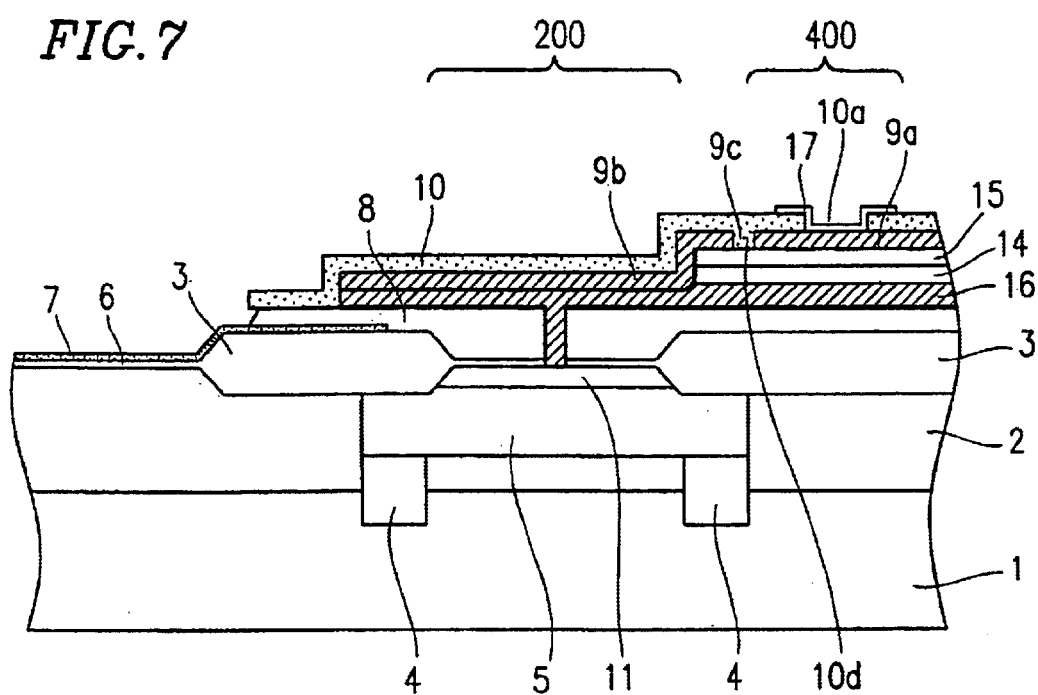
FIG. 7 is a cross-sectional view illustrating still another structure of a photodiode according to the second example of the present invention.
Figure 8:
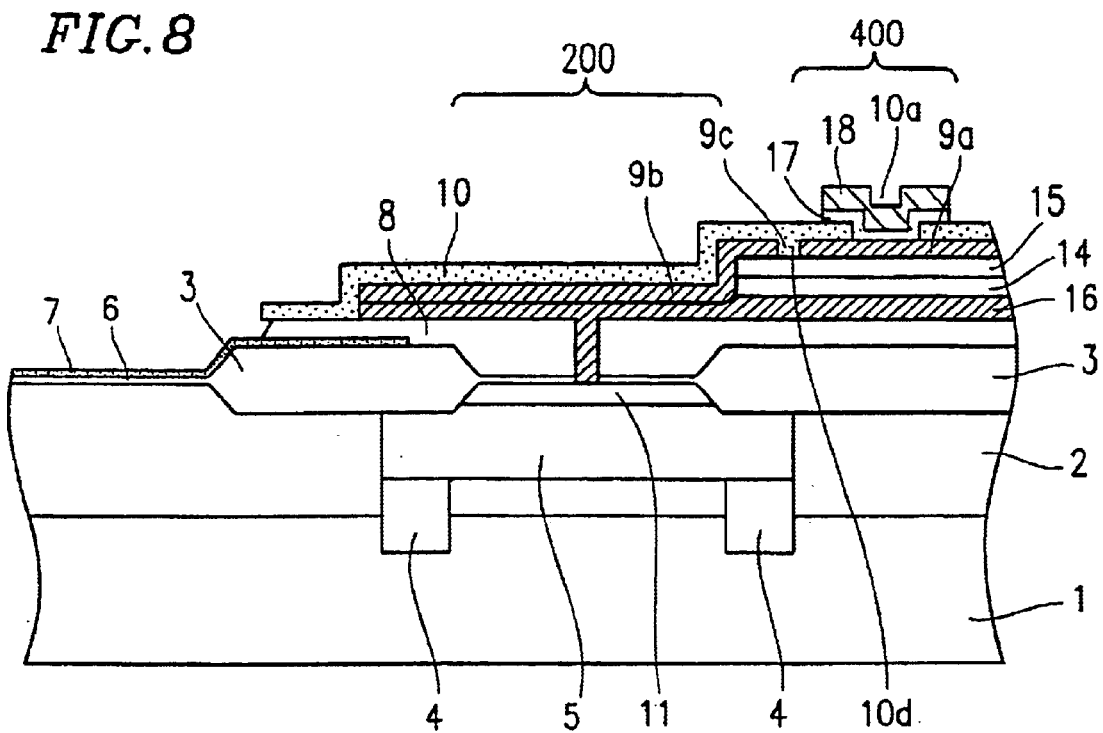
FIG. 8 is a cross-sectional view illustrating still another structure of a photodiode according to the second example of the present invention.

FIGS. 6, 7 and 8 are schematic cross-sectional views of photodiodes as modifications of the second example of the present invention.

As shown in FIG. 6, the TiW layer 12 as an anti-corrosive metal layer may be provided below the second AlSi layer 16 as well as below the first AlSi layer 9. Due to such a structure, even when the second AlSi layer 16 is corroded, the TiW layer 12 acting as the signal line together with the second AlSi layer 16 prevents the signal line from being electrically ruptured.

As shown in FIG. 7, the exposed portion of the window-side portion 9a of the first AlSi layer 9 may be covered with an anti-corrosive layer, for example, a TiW layer 17. Due to such a structure, the exposed portion of the window-side portion 9a is not corroded, and therefore the light shielding characteristic of the photodiode is not deteriorated.

In the bonding pad section 500 also, the first AlSi layer 9 is exposed to the opening formed by etching in the PSG passivation layer 10. It is not preferable, however, to form the TiW layer 17 in the opening of the bonding pad section 500 for the following reasons. (1) Where the TiW layer 17 is provided in the opening of the bonding pad section 500, the adherence between a gold pole and the bonding pad section 500 is deteriorated when bonding to the bonding pad section 500 is performed. As a result, the gold pole may come off from the bonding pad section 500. (2) Since TiW is a hard metal, the TiW layer 17 may be destroyed by the impact of bonding, resulting in exposing the window-side portion 9a of the first AlSi layer 9 below the TiW layer 17.

Such a problem can be solved by the structure shown in FIG. 8. Although FIG. 8 only shows the window area 400, the bonding pad section 500 has substantially the same structure. Both in the window area 400 and the bonding pad section 500, after the opening 10a is formed by etching in the PSG passivation layer 10, the TiW layer 17 is formed in the opening 10a. On the TiW layer 17, a gold (Au) layer 18 is provided. In such a structure, the adherence between the gold pole and the bonding pad section 500 during the bonding is improved. Since gold is a soft metal, the TiW layer 17 below the gold layer 18 is not destroyed by the bonding. Therefore, the window-side portion 9a of the first AlSi layer 9 below the TiW layer 17 can be protected against corrosion.

Figure 9:
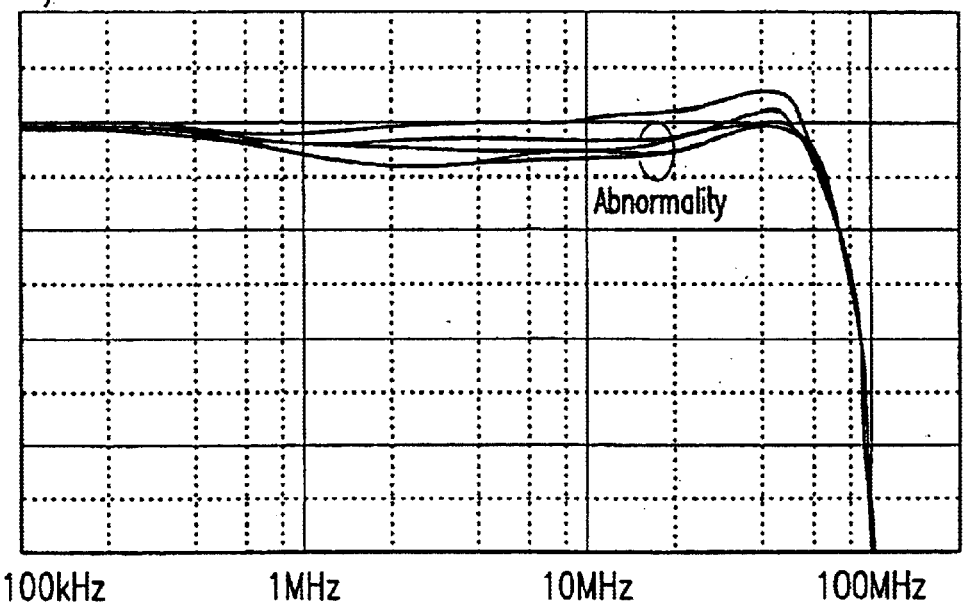
FIG. 9 is a graph illustrating a response characteristic of photodiodes in which an area of an opening of a window area is smaller than that of a preferable structure.

In the first and second examples, it is preferable that the opening 10a in the window area 400 has an area larger than ⅕₀th of the area of the light receiving area 100. Five photodiode samples in which the area of the opening 10a is ⅕₀th of the area of the light receiving area 100 and five photodiode samples in which the area of the opening 10a is larger than ⅕₀th of the area of the light receiving area 100 were tested for the response characteristic. FIG. 9 shows the results of the five samples in which the area of the opening 10a is ⅕₀th of the area of the light receiving area 100. In FIG. 9, the vertical axis represents the output value (dB), and the horizontal axis represents the frequency (Hz). It is appreciated that four out of five samples exhibited a response characteristic having an abnormal waveforms. By contrast, in the case of the photodiodes in which the area of the opening 10a is larger than ⅕₀th of the area of the light receiving area 100, none of the five samples exhibited any response characteristic having an abnormal waveform.

Figure 10:
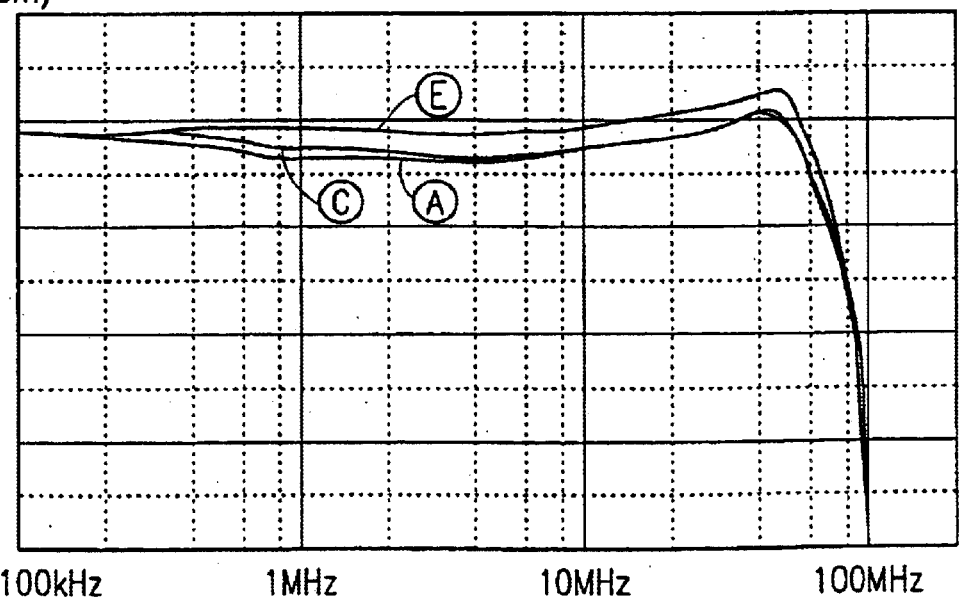
FIG. 10 is a graph illustrating a response characteristic of photodiodes having different distances between the light receiving area and the window area.

In the first and second examples, it is preferable that the distance between the window area 400 and the light receiving area 200 is 200 μm or less. Photodiode samples A, C and E having different distances between the window area 400 and the light receiving area 200 were tested for the response characteristic. The results are shown in FIG. 10. In FIG. 10, the vertical axis represents the output value (dB) and the horizontal axis represents the frequency (Hz). The distance between the window area 400 and the light receiving area 200 is longest in photodiode sample A, second largest in photodiode sample C, and shortest in photodiode sample E. In photodiode sample E, the distance between the window area 400 and the light receiving area 200 is 200 μm. As shown in FIG. 10, the waveform of photodiode sample E does not exhibit any abnormality, but the waveforms of photodiode samples A and C exhibit abnormality.

In the photodiode 201 in the second example shown in FIG. 5, the second AlSi layer 16 is provided below the silicon nitride layer 14 in order to prevent light acting as noise from being incident through the separation opening 9c. Substantially the same effect is provided where the second AlSi layer 16 is formed only in an area directly below the separation opening 9c and the vicinity thereof.

Figure 11:
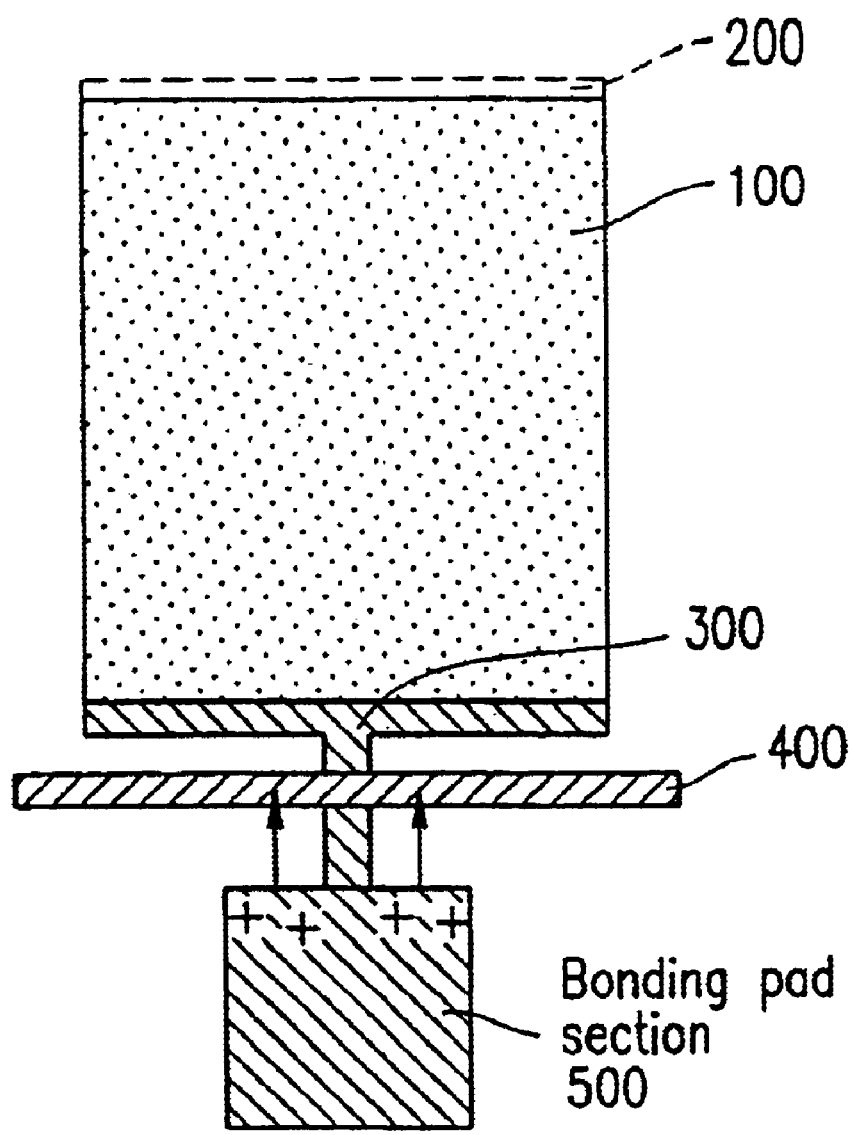
FIG. 11 is a plan view of a photodiode according to the present invention having a window area between the light receiving area and a bonding pad section.

In the first and second examples, it is more preferable that the window area 400 is provided between the light receiving area 100 and the bonding pad section 500 for supplying a potential to the cathode section 300 or the like as shown in FIG. 11 (schematic plan view). In FIG. 11, the bonding pad section 500 is connected to the cathode section 300 for the sake of simplicity.

Usually, a positive potential is applied to the cathode section 300 from the bonding pad section 500. The bonding pad section 500 is not limited to providing a positive potential.

The bonding pad section 500 is supplied with a potential through a bonding wire formed of Au or the like. When a potential is supplied to the bonding pad section 500 through the bonding wire, electric charges spread from the bonding pad section 500 to the anti-reflection film 70 (FIG. 5) and the insulating passivation layer such as, for example, the PSG passivation layer 10 in the vicinity of the bonding pad section 500. In the structure shown in FIG. 11 in which the window area 400 is provided between the light receiving area 100 and the bonding pad section 500, the charges can be effectively removed through the window area 400 and prevented from spreading to the anti-reflection film 70 and the insulating passivation layer.

Figure 12:
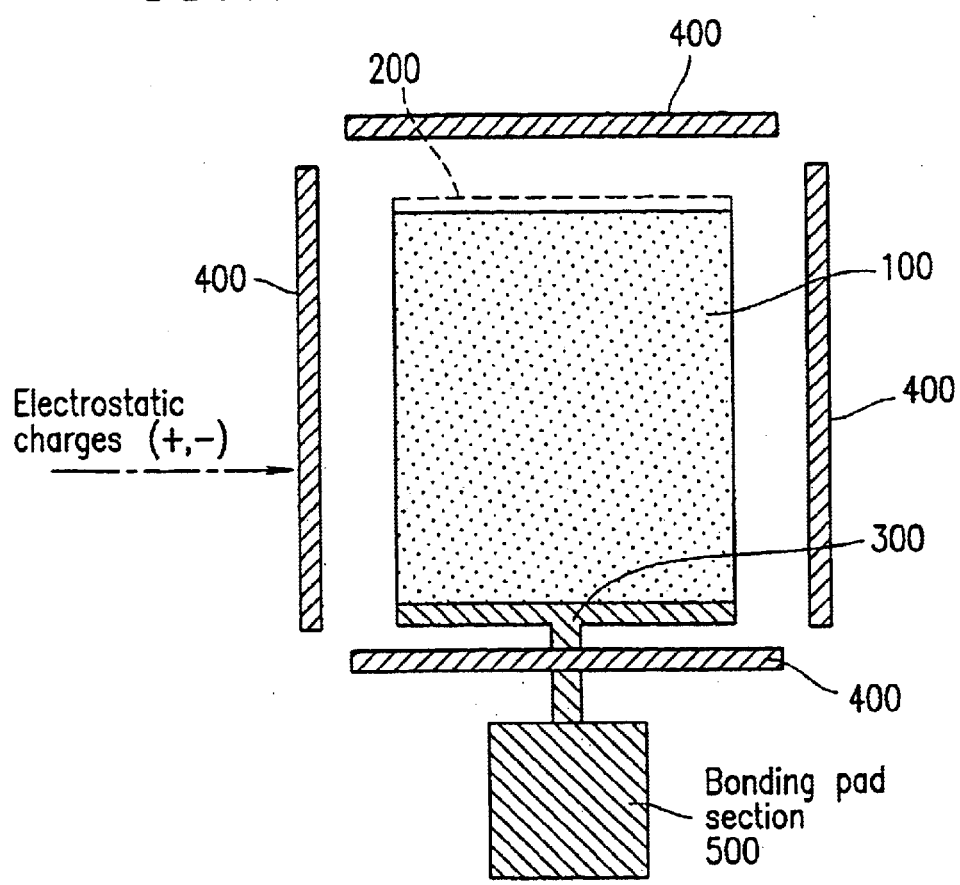
FIG. 12 is a plan view of a photodiode according to the present invention having window areas along four sides of, and in the vicinity of, the light receiving area.

As shown in FIG. 12, a plurality of window areas 400 may be provided along four sides of, and in the vicinity of, the light receiving area 100. In such a structure, the window areas 400 can remove the electrostatic charges migrating from the areas other than the photodiode in the chip toward the light receiving area 100 as well as removing the electric charges from the bonding pad section 500.

Figure 13:
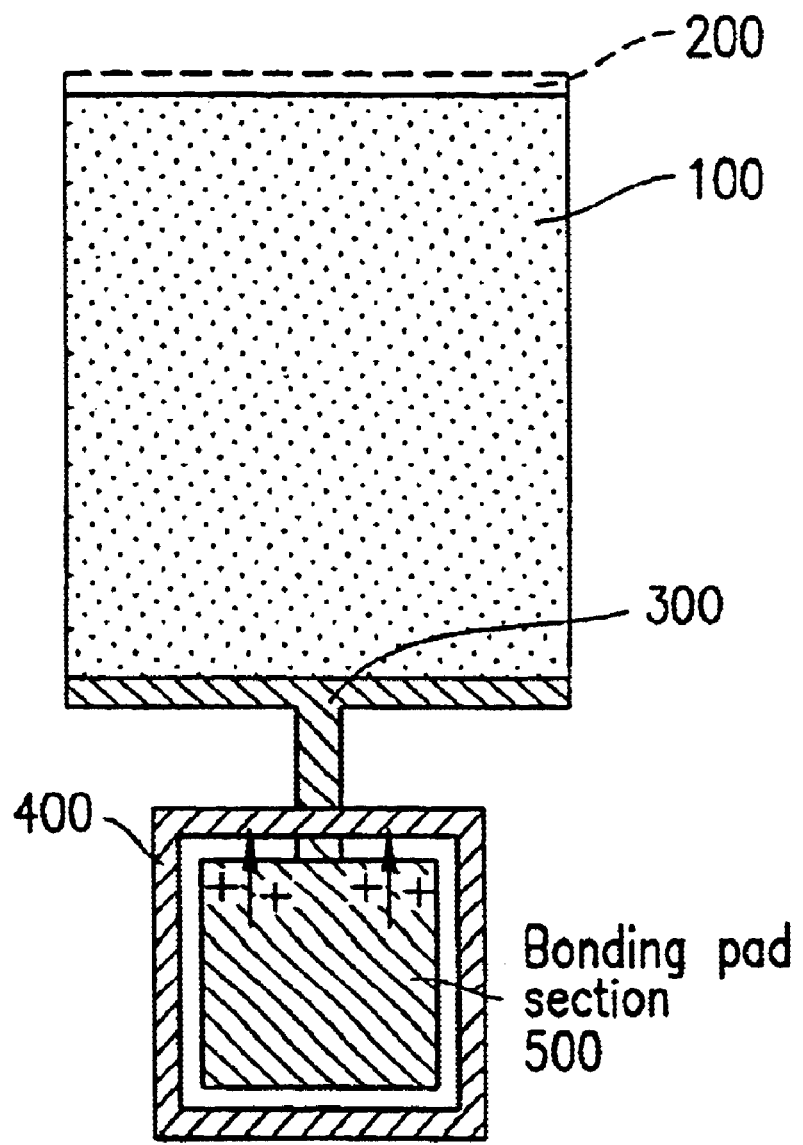
FIG. 13 is a plan view of a photodiode according to the present invention having a window area surrounding the bonding pad section.

It is also preferable that the window area 400 is provided so as to completely surround the bonding pad section 500 as shown in FIG. 13 (schematic plan view). In such a structure, the charges spreading from the bonding pad section 500 cannot avoid crossing the window area 400. As a consequence, the efficiency of removing unnecessary charges can be improved.

Figure 14:
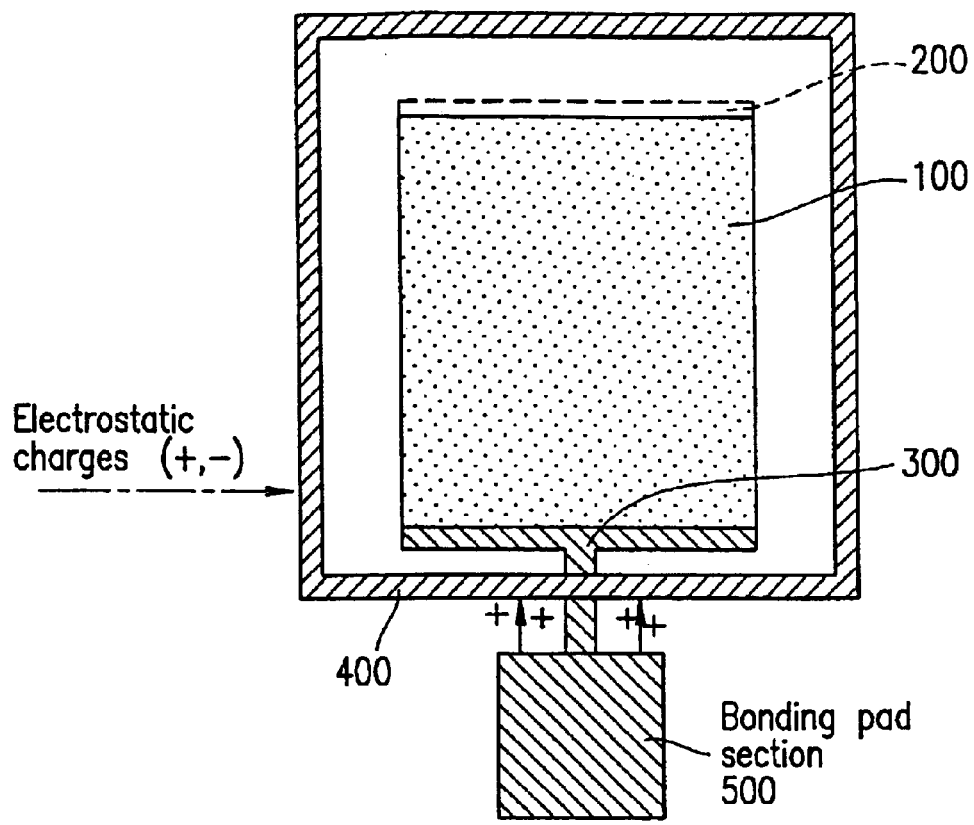
FIG. 14 is a plan view of a photodiode according to the present invention having a window area surrounding the light receiving area.

In the first and second examples, it is also preferable that the light receiving area 100 is completely surrounded by the window area 400 as shown in FIG. 14 (schematic plan view). In such a structure, charges such as electrostatic charges generated on the wafer by dicing or the like and migrating toward the light receiving area 100 cannot avoid crossing the window area 400. Therefore, the absorption ratio of the charges, such as electrostatic charges, by the window area 400 is further improved. The number of light receiving areas 100 surrounded by the window area 400 is not limited to one, but a plurality of light receiving areas 100 may be surrounded by a respective window area 400.

Figure 15:
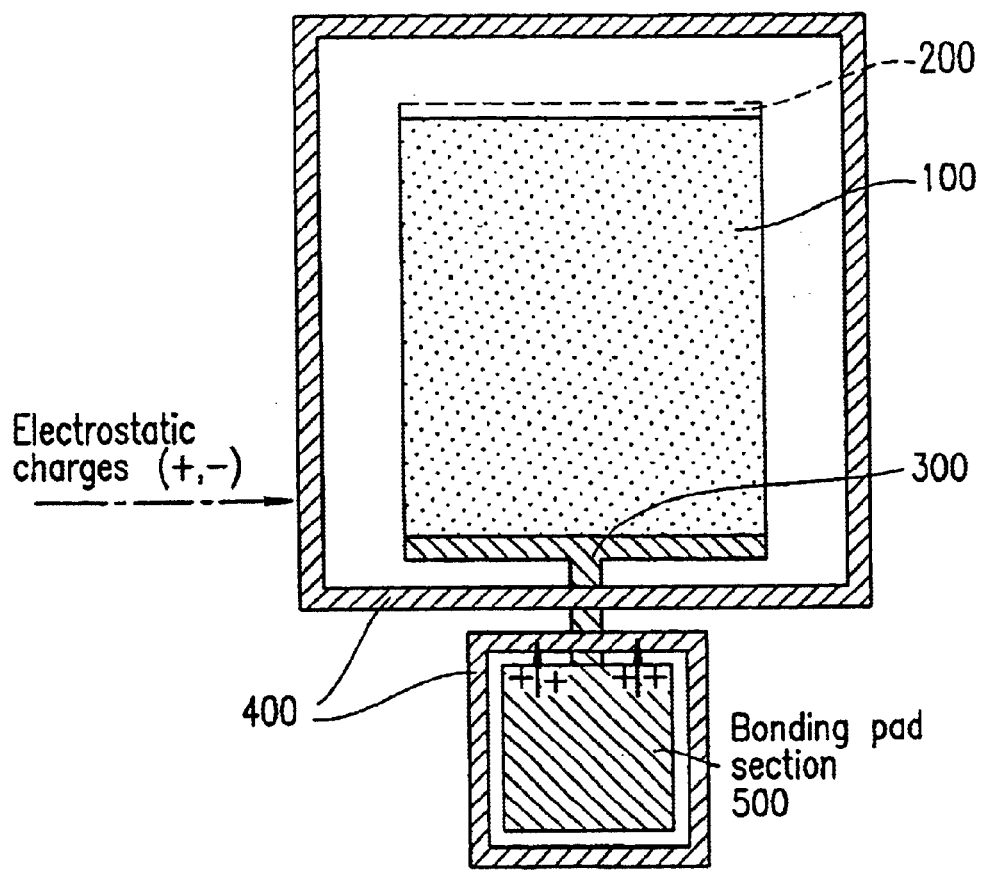
FIG. 15 is a plan view of a photodiode according to the present invention having a window area surrounding each of the bonding pad section and the light receiving area.

In the first and second examples, it is also preferable that the light receiving area 100 and the bonding pad section 500 are each completely surrounded by the window area 400 as shown in FIG. 15 (schematic plan view). In such a structure, charges such as electrostatic charges generated on the wafer by dicing or the like and migrating toward the light receiving area 100 and the bonding pad section 500 cannot avoid crossing the window area 400. Therefore, the ratio of abnormal junction capacity caused by the electrostatic charges reaching the light receiving area 100 can further be reduced.

EXAMPLE 3

Figure 16:
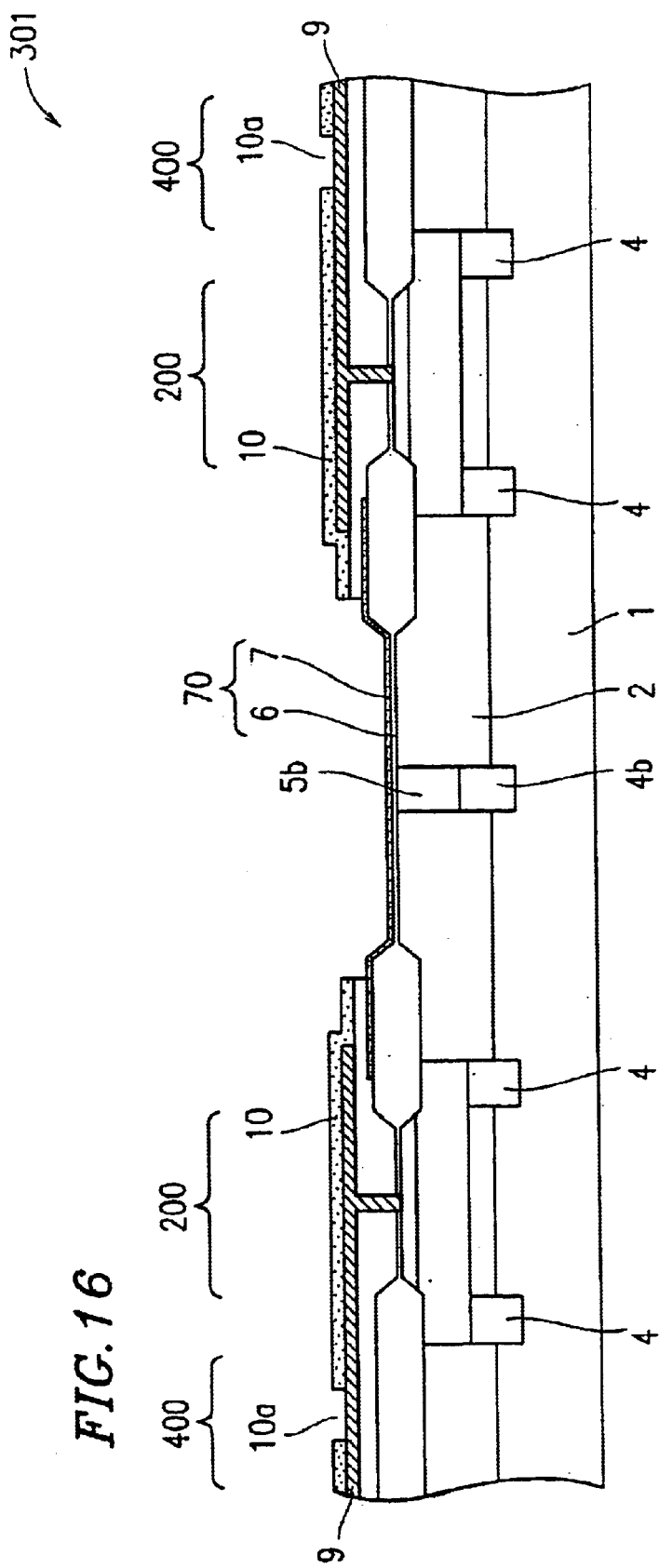
FIG. 16 is a cross-sectional view illustrating a structure of a photodiode according to a third example of the present invention.
Figure 17:
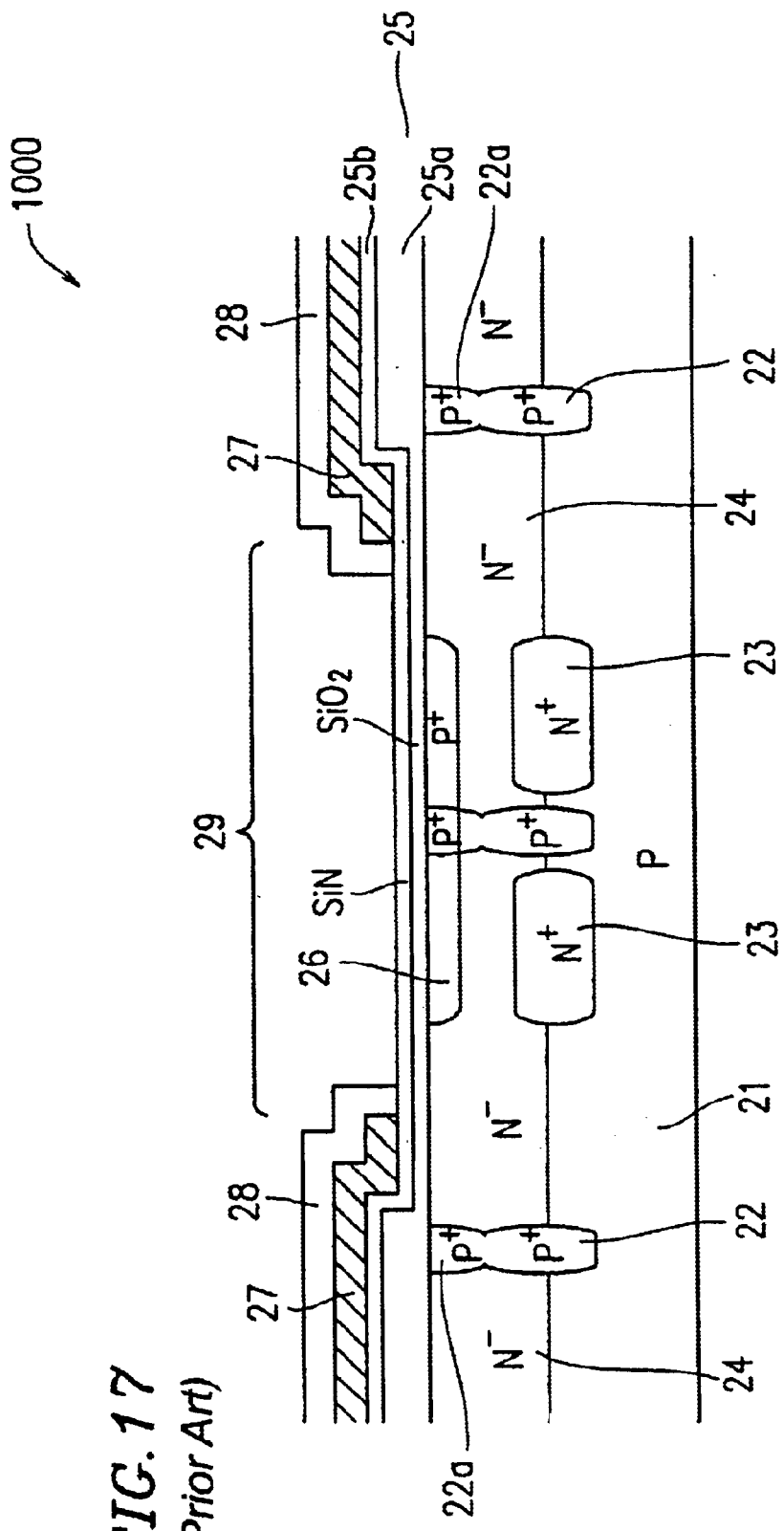
FIG. 17 is a cross-sectional view illustrating a structure of a conventional photodiode.

FIG. 16 is a schematic cross-sectional view of a divided-type photodiode 301 according to a third example of the present invention. The photodiode 301 is obtained by dividing the N-type epitaxial layer 2 in the light receiving area 100 of the photodiode 101 shown in FIG. 1 by a P⁺-type buried diffused layer 4 and a P-type diffused layer 5.

The N-type epitaxial layer 2 is laminated on the P-type silicon substrate 1. At an interface between the P-type silicon substrate 1 and the N-type epitaxial layer 2, a plurality of P⁺-type buried diffused layers 4b (only one is shown in FIG. 16) are formed at selected positions. The P-type diffused layer 5b reaching a surface of the N-type epitaxial layer 2 is provided on each P⁺-type buried diffused layer 4b. The P⁺-type buried diffused layer 4b and the P-type diffused layer 5b divide the N-type epitaxial layer 2 into a plurality of regions. The anode sections 200 and the window areas 400 are provided symmetrically with respect to the light receiving area 100. The divided-type photodiode 301 has substantially the same structure as that of the photodiode 101 in FIG. 1 on the other points.

In the photodiode 301 shown in FIG. 16, the window areas 400 including the openings 10a and areas in the vicinity thereof are formed at positions opposite to the light receiving area 100 with respect to the anode sections 200. The window areas 400 are provided on the AlSi layer 9 as a conductive light shielding layer. Due to such a structure, charges such as electrostatic charges generated on the silicon nitride layer 7 of the anti-reflection film 70 and on the insulating passivation layer such as the PSG passivation layer 10 are removed through the opening 10a in each window area 400. Therefore, the junction capacitance of the photodiode 301 can be prevented from being increased as a result of the charges such as electrostatic charges being accumulated. As a result, deterioration in the response speed of the photodiode 301 caused by the increase in the junction capacitance is avoided. The structure of the photodiode 301 also solves the problem of a conventional divided-type photodiode that charges such as electrostatic charges on the silicon nitride layer of the anti-reflection film in the light receiving area invert the conductivity type of a surface of the P-type diffused layer, which divide the light receiving area, into N-type. This causes shortcircuiting between two regions of the N-type epitaxial layer 2 interposing the P-type diffused layer. The divided-photodiode 301 shown in FIG. 16 solves such a problem and thus has improved reliability.

A light receiving device with a built-in circuit according to the present invention is obtained by producing any of the photodiodes described in the first through third examples and a signal processing circuit for the photodiode on a single substrate.

More specifically, such a light receiving device with a built-in circuit is produced by forming a signal processing circuit device including, for example, an NPN transistor or a vertically stacking PNP transistor in an area of the N-type epitaxial layer which is electrically isolated from the area having the photodiode.

In the above examples, AlSi is used for a conductive layer acting both as a signal line and a light shielding layer, and TiW is as an anti-corrosive conductive layer. The present invention is not limited to these materials, and any other suitable materials are usable. The anti-reflection film may be-formed of materials other than silicon oxide and silicon nitride, and the insulating passivation layer may be formed of materials other than PSG.

A photodiode according to the present invention includes a window area having an opening in a passivation layer provided on a conductive layer in the vicinity of a light receiving area. The conductive layer is partially exposed to the opening. Therefore, electrostatic charges generated on an anti-reflection film and on the passivation layer in the light receiving area can be removed through the opening. This prevents the charges from accumulating at an interface between a silicon oxide layer and a silicon nitride layer included in the anti-reflection film. As a result, an abnormal increase in the junction capacitance of the photodiode is avoided, and the photodiode has improved response characteristic.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A photodiode, comprising:
   one of a first conductivity type semiconductor substrate and a first conductivity type semiconductor layer;
   a second conductivity type semiconductor layer provided on the one of the first conductivity type semiconductor substrate and the first conductivity type semiconductor layer;
   an anti-reflection film provided in a light receiving area;
   a first conductive layer provided in an area in the vicinity of the light receiving area, the conductive layer being provided over the first and/or second conductivity type semiconductor layer; and
   a passivation layer provided over at least a portion of the first conductive layer, wherein:
   light incident on the photodiode is detected by a junction of the one of the first conductivity type semiconductor substrate and the first conductivity type semiconductor layer, and the second conductivity type semiconductor layer,
   the first conductive layer is divided into a first portion and a second portion insulated therefrom by a gap or aperture defined in the first conductive layer, wherein the first portion of the first conductive layer acts as a signal line of the photodiode and the second portion of the first conductive layer does not act as a signal line for the photodiode but rather is for removing electrostatic discharge; and
   the area in the vicinity of the light receiving area includes a window area having an opening in the passivation layer for partially exposing the second portion of the first conductive layer for removing electrostatic charge via the window, said window being spaced apart from, and not located in, the light receiving area.

2. A photodiode according to claim 1, further comprising an anti-corrosive conductive layer provided below the first conductive layer.

3. A photodiode according to claim 1, further comprising a second conductive layer, wherein the first conductive layer is divided into the portion acting as the signal line and the portion not acting as the signal line by a separation area comprised of the gap or aperture, and the second conductive layer is provided below the separation area.

4. A photodiode according to claim 1, further comprising a second conductive layer provided below the first conductive layer, and an anti-corrosive conductive layer provided below at least the second conductive layer.

5. A photo diode according to claim 1, further comprising an anti-corrosive conductive layer for covering the opening.

6. A photodiode according to claim 5, wherein the anti-corrosive conductive layer is formed of a titanium-tungsten alloy, the photodiode further comprising a gold layer on the anti-corrosive conductive layer.

7. A photodiode according to claim 1, wherein the opening has an area which is larger than $1/50^{th}$ of an area of the light receiving area.

8. A photodiode according to claim 1, wherein a distance between the window area and the light receiving is 200 $\mu$m or less.

9. A photodiode according to claim 1, wherein the window area is provided between the light receiving area and a bonding pad section.

10. A photodiode according to claim 9, wherein the window area is provided so as to surround the bonding pad section.

11. A photodiode according to claim 9, wherein the window area is provided so as to surround the light receiving area.

12. A photodiode according to claim 10, wherein the window area is provided so as to surround the bonding pad section and the light receiving area.

13. A photodiode according to claim 11, wherein the window area is provided so as to surround the bonding pad section and the light receiving area.

14. A photodiode according to claim 1, further comprising another first conductivity type semiconductor layer for dividing the second conductivity type semiconductor layer into a plurality of regions, the another first conductivity type semiconductor layer being provided on the one of the first conductivity type semiconductor substrate and the first conductivity type semiconductor layer, where the light incident on the photodiode is detected by a junction of the one of the first conductivity type semiconductor substrate and the first conductivity type semiconductor layer, and at least one of the plurality of regions of the second conductivity type semiconductor layer.

15. A light receiving device with a built-in circuit, comprising a photodiode according to claim 1 and a signal processing circuit for processing an electric signal obtained by photoelectric conversion performed by the photodiode, the photodiode and the signal processing circuit being provided on a single substrate.

16. The photodiode of claim 1, wherein the first conductive layer comprises AlSi.

17. The photodiode of claim 1, wherein the first conductive layer is in electrical communication with the first and/or second conductivity type semiconductor layer through a contact hole defined in an insulating layer provided between the first conductive layer and the first and/or second conductivity type semiconductor layer.

18. The photodiode of claim 1, wherein the first conductive layer comprises a metal.

19. The photodiode of claim 1, further comprising:

an insulating layer provided over a first part of, but not all of, the anti-reflection film, so that neither the insulating layer nor any metal layer covers a second part of the anti-reflection film which is at least partially located in the light receiving area; and wherein the first conductive layer is provided over at least part of the insulating layer in the area in the vicinity of the light receiving area.

20. The photodiode of claim 1, wherein an anode or cathode section is located between the window and the light receiving area.

* * * * *